(12) United States Patent
Mack

(10) Patent No.: US 8,427,252 B2
(45) Date of Patent: Apr. 23, 2013

(54) OSCILLATORS WITH LOW POWER MODE OF OPERATION

(75) Inventor: Michael P. Mack, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 141 days.

(21) Appl. No.: 13/149,662

(22) Filed: May 31, 2011

(65) Prior Publication Data

US 2012/0306585 A1    Dec. 6, 2012

(51) Int. Cl.
*H03B 5/30* (2006.01)
(52) U.S. Cl.
USPC .......................................... 331/182; 331/160
(58) Field of Classification Search .................. 331/160, 331/182
See application file for complete search history.

(56) References Cited

U.S. PATENT DOCUMENTS

| 6,329,884 | B1 | 12/2001 | Tsukagoshi et al. |
| 6,559,730 | B1 | 5/2003 | Marvin et al. |
| 2005/0007205 | A1 | 1/2005 | Bridger |
| 2009/0088194 | A1 | 4/2009 | Petty, Jr. et al. |
| 2009/0121792 | A1 | 5/2009 | Travis |
| 2010/0188157 | A1 * | 7/2010 | Kondo .......................... 331/46 |
| 2010/0321124 | A1 | 12/2010 | Rangarajan et al. |

OTHER PUBLICATIONS

International Search Report and Written Opinion of the International Searching Authority, corresponding International Application PCT/US2011/038859, mailed Sep. 27, 2011.

* cited by examiner

*Primary Examiner* — Joseph Chang
(74) *Attorney, Agent, or Firm* — Mahamedi Paradice Kreisman LLP

(57) ABSTRACT

A method and apparatus for configuring an oscillator circuit to selectively switch between a low power mode and a normal mode of operation. The oscillator circuit includes an oscillator core in parallel with a dynamically configurable gain circuit. The oscillator core is configured to generate a clock signal. One or more gain elements of the gain circuit can be selectively disabled to reduce the operating power level of the oscillator circuit during a low power mode.

19 Claims, 11 Drawing Sheets

OSCILLATORS WITH LOW POWER MODE OF OPERATION

TECHNICAL FIELD

The present embodiments relate generally to oscillator circuitry and specifically relate to oscillators with a low power mode of operation.

BACKGROUND OF RELATED ART

Timing of various components of a computer system is synchronized by clock signals generated by oscillator circuits. For instance, conventional mother boards of personal computers include a real time clock (RTC) and a crystal oscillator circuit to provide the main clock for mother board components such as input/output (I/O) controllers. Clock signals are also essential in numerous other electronic systems and devices that process digital signals. Radio communication systems and devices use oscillator circuits as an indispensible part of their modulation and demodulation circuitries to generate sinusoidal signals. In some applications, high-accuracy, high-speed clock signals are required. For example, network devices need to maintain high-accuracy timers even when operating in a low power mode. However, generating high-accuracy oscillators that generate high-speed clock signals can consume significant amounts of power.

Many oscillator circuits generating oscillations with precise frequencies use a crystal as an oscillator core to govern their resonating signals. In order to sustain oscillations of a crystal oscillator, a gain element such as a transistor can be used to amplify the resonating signal and feed it back to the oscillator core. For example, the conventional crystal oscillator 100 of FIG. 1 uses a transistor M1 as the gain element. The core of oscillator 100 is a crystal 110 connected in parallel with a resistor 120. A current source 130, connected between a power supply Vcc and a drain of the transistor M1 at an output node 140, provides a bias current for the transistor M1. The resistor 120, connected between a gate of the transistor M1 and an output node 140 of the conventional crystal oscillator 100, provides a negative feedback between the drain and the gate of the transistor M1, which in turn ensures a stable DC operating point of the conventional crystal oscillator 100. A circuit 150 may use a clock signal CLK generated at the output node 140, for instance, to synchronize timing of its various components.

The current source 130 of the conventional crystal oscillator 100 is always ON and there is no provision for lowering a power level of the crystal oscillator 100 for time periods that the circuit 150 is fully or partially in an inactive (e.g., sleep) mode. Consequently, the conventional crystal oscillator 100 may be impractical in applications for which lower power consumption is increasingly important.

Current attempts to address this problem typically involve switching to a separate low power oscillator (LPO) to generate clock signals during a low power mode of operation. For instance, a circuit 200 of FIG. 2 illustrates a conventional solution that includes a main oscillator 210, an LPO 220, and a multiplexer (MUX) 230. The MUX 230 selectively connects either the main oscillator 210 or the LPO 220 to a circuit CKT 240 in response to the select signal SEL. For example, during a normal mode, the select signal SEL is driven to a first state that allows the main oscillator 210 to provide clock signals to the circuit CKT 240, and during a low power mode, the select signal SEL is driven to a second state that allows the LPO 220 to provide clock signals to the circuit CKT 240.

The problem with this solution is that it uses a separate LPO during the low power mode, which undesirably increases circuit size and complexity. In addition, LPOs are not designed to generate high-accuracy and/or high-speed clock signals, as is typically required for many applications such as real time clocks or network devices. Thus, there is a need for a novel architecture of an oscillator circuit that can provide a low power mode of operation without the disadvantages of the circuit 200.

BRIEF DESCRIPTION OF THE DRAWINGS

The present embodiments are illustrated by way of example and are not intended to be limited by the figures of the accompanying drawings, where.

Like reference numerals refer to corresponding parts throughout the drawing figures.

DETAILED DESCRIPTION

Figure 1:
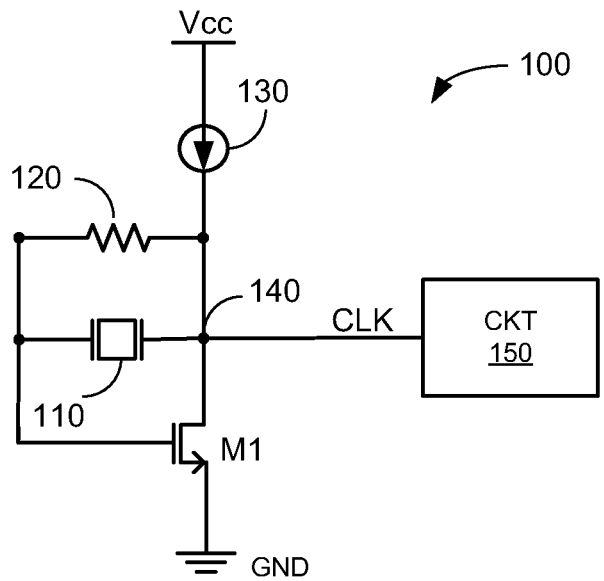
FIG. 1 is a schematic diagram of a conventional oscillator circuit.
Figure 2:
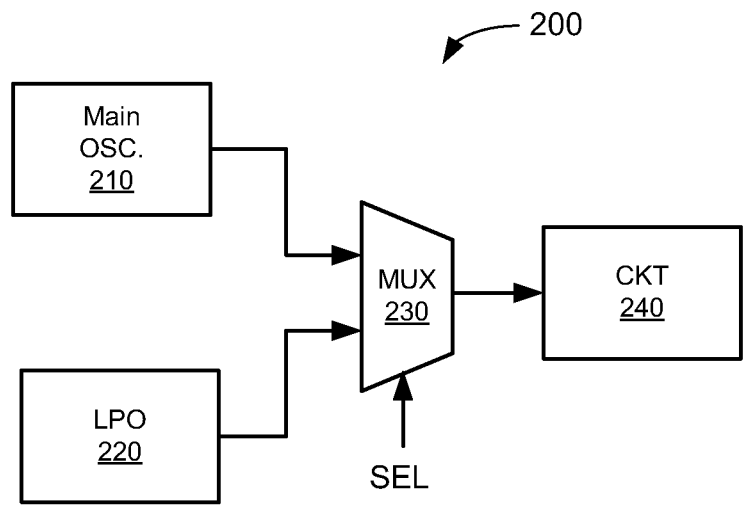
FIG. 2 is a schematic diagram of a conventional oscillator circuit including a main oscillator and an LPO.

A method and apparatus for generating clock signals using oscillator circuits having a low power mode of operation are disclosed. In the following description, numerous specific details are set forth such as examples of specific components, circuits, and processes to provide a thorough understanding of the present disclosure. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. The term "coupled" as used herein means connected directly to or connected through one or more intervening components or circuits. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of myriad physical or logical mechanisms for communication between components. Further, the logic levels assigned to various signals in the description below are arbitrary, and therefore may be modified (e.g., reversed polarity) as desired. As another example, circuits described or depicted as including metal oxide semiconductor (MOS) transistors may alternatively be implemented using bipolar transistors or any other technology in which a signal-controlled current flow may be achieved. Also, signals referred to herein as clock signals may alternatively be strobe signals or any other signals that provide timing control. Accordingly, the present embodiments are not to be construed as limited to specific examples described herein but rather includes within its scope all embodiments defined by the appended claims.

An oscillator circuit in accordance with present embodiments is configured to selectively switch between a low power mode and a normal mode of operation. The oscillator circuit includes an oscillator core that includes an oscillation generator in parallel with a gain circuit. The oscillator core is configured to generate clock signals. One or more elements of the gain circuit can be selectively disabled to reduce the operating power level of the oscillator circuit (e.g., during the low power mode) without adversely affecting accuracy of generated clock signals.

For some embodiments, the oscillator circuit is embedded in an integrated circuit of a semiconductor chip, which may at times enter into a sleep mode. When the semiconductor chip enters the sleep mode, the oscillator circuit can be dynamically switched to a low power mode of operation. For other embodiments, the oscillator circuit can enter into the low power mode of operation even when the chip is not in the sleep mode. A low power mode signal may trigger a state machine to generate enable signals that can disable selected portions of the gain circuit to reduce the operational power of the oscillator circuit.

Figure 3:
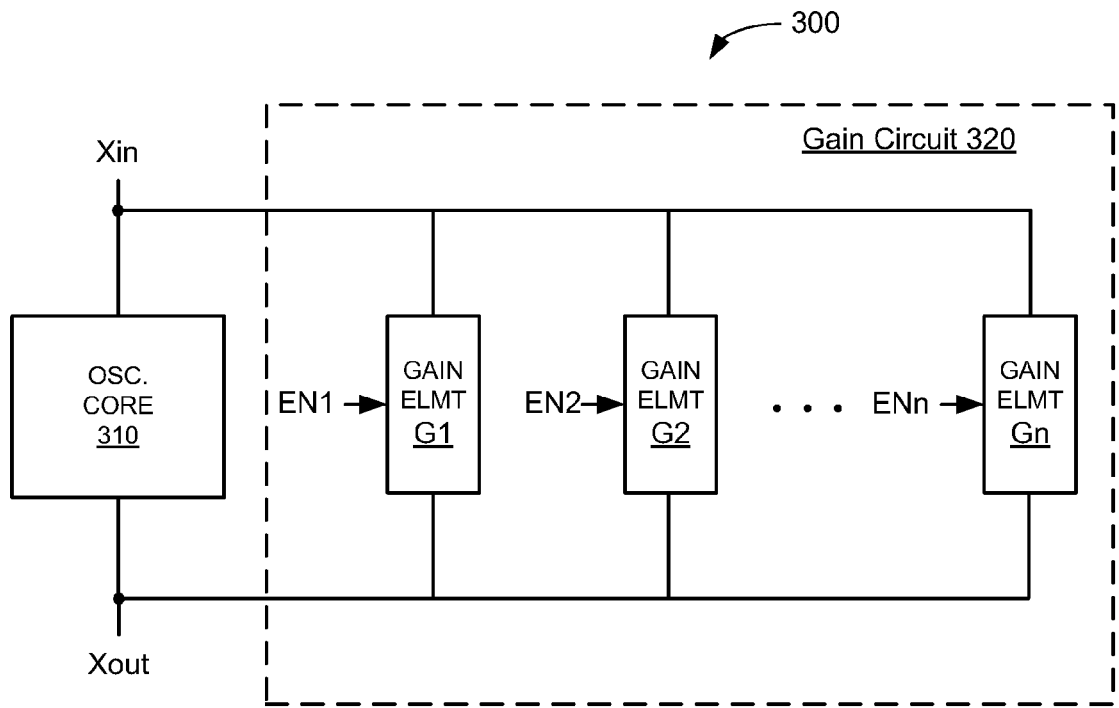
FIG. 3 is a block diagram of an oscillator circuit in accordance with some embodiments.

FIG. 3 is a block diagram of an oscillator circuit 300 in accordance with some embodiments. An oscillator core 310 is connected in parallel with a dynamically configurable gain circuit 320. The oscillator core 310, which is well-known, generates electrical oscillations that ultimately produce clock signals at terminals Xin and Xout. The dynamically configurable gain circuit 320 includes a plurality of gain elements G1-Gn selectively connected in parallel with the oscillator core 310. The gain elements G1-Gn are selectively enabled and disabled by respective enable signals EN1-ENn. For example, enable signal EN2 selectively enables and disables gain element G2 to be operational. When enabled, the gain elements G1-Gn provide a gain for the oscillator core 310. When a gain element is disabled, the gain element does not conduct current between the supply voltage and ground potential, and therefore does not provide a gain for the oscillator core 310 and, perhaps more importantly for present embodiments, consumes minimal (if any) power. The enable signals may be generated by any suitable circuit, logic, and/or processor. Thus, in accordance with present embodiments, selectively disabling one or more of the gain elements G1-Gn advantageously lowers the operational power of the oscillator circuit 300 during the low power mode. For some embodiments, the gain elements G1-Gn may provide a fraction of their normal gain to the oscillator core 310 during the low power mode, for example, by intermittingly pulsing their corresponding enable signals to an asserted state such that the gain elements are enabled only during brief time intervals (e.g., and disabled for longer time intervals). In this manner, the gain circuit 320 can provide a minimal gain to the oscillator core 310 to ensure that the oscillator core 310 is able to continue generating the clock signal during the low power mode, while also significantly reducing power consumption by not drawing current during the longer time intervals during which the gain elements are disabled.

Although the embodiment shown in FIG. 3 depicts all gain elements G1-Gn being controlled by the enable signals EN1-ENn, for other embodiments, one or more of the gain elements G1-Gn may not receive any enable signals, but rather remain continuously operational irrespective of the enable signals. This may be desirable for sustaining stable oscillations of the oscillator core 310 by allowing some of the gain elements to continuously provide operating power for the oscillator core 310. For other embodiments, oscillator circuit 300 may include one or more additional gain elements (not shown in FIG. 3 for simplicity) that remain in continuous operation during the low power mode.

Figure 4:
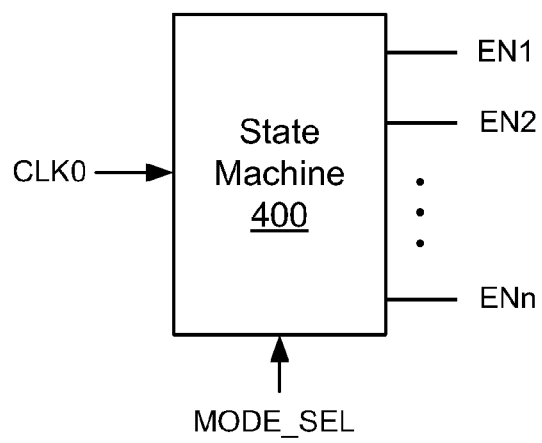
FIG. 4 is a functional diagram of a state machine providing enable signals for the oscillator circuit of FIG. 3 in accordance with some embodiments.

FIG. 4 is a functional diagram of a state machine 400 providing enable signals EN1-ENn for the oscillator circuit 300 of FIG. 3 in accordance with some embodiments. The state machine 400 receives a clock signal CLK0 and a mode select signal MODE_SEL, and generates the enable signals EN1-ENn in response thereto. The clock signal CLK0 is derived from an output of the oscillator circuit 300, and for some embodiments is synchronized with the mode select signal MODE_SEL as described below with respect to FIG. 9. The mode select signal MODE_SEL is used to indicate a mode of operation of the oscillator circuit 300. For example, the mode select signal MODE_SEL is driven to a first state to select a normal mode of operation, and is driven to a second state to select a low power mode of operation. More specifically, when MODE_SEL is driven to the first state to select the normal mode of operation, a number of the enable signals EN1-ENn are asserted to enable all corresponding gain elements G1-Gn, thereby allowing oscillator circuit 300 to operate in a normal manner (e.g., with enough gain to attain acceptable performance). Conversely, when MODE_SEL is driven to the second state to select the low power mode of operation, the enable signals EN1-ENn are selectively asserted to selectively disable one or more of the corresponding gain elements G1-Gn, thereby allowing oscillator circuit 300 maintain its clock generation function while significantly reducing power consumption. In this manner, the present embodiments allow for a significant reduction in power consumption for oscillator circuits (e.g., during low power mode) without employing a separate low-power oscillator circuit.

Figure 5A:
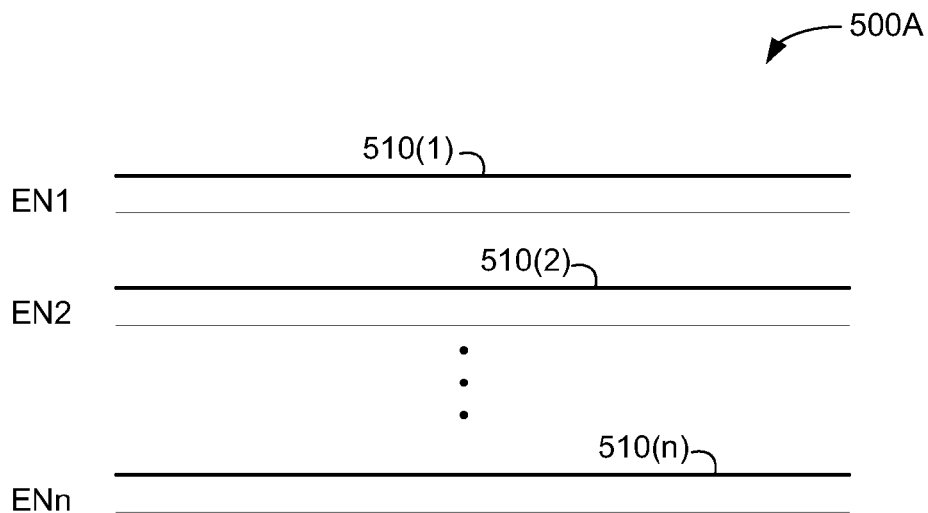
FIG. 5A depicts a timing diagram of a set of enable signal waveforms generated by the state machine of FIG. 4 in accordance with some embodiments.

FIG. 5A depicts a timing diagram 500A illustrating an exemplary set of enable signal waveforms 510(1)-510(n) generated by the state machine 400 of FIG. 4 during the normal operational mode. The enable signal waveforms 510(1)-510(n), which correspond to the respective enable signals En1-ENn, are continually asserted to enable a number of the gain elements G1-Gn to provide continuous gain for the oscillator core 310 during the normal mode of operation.

Figure 5B:
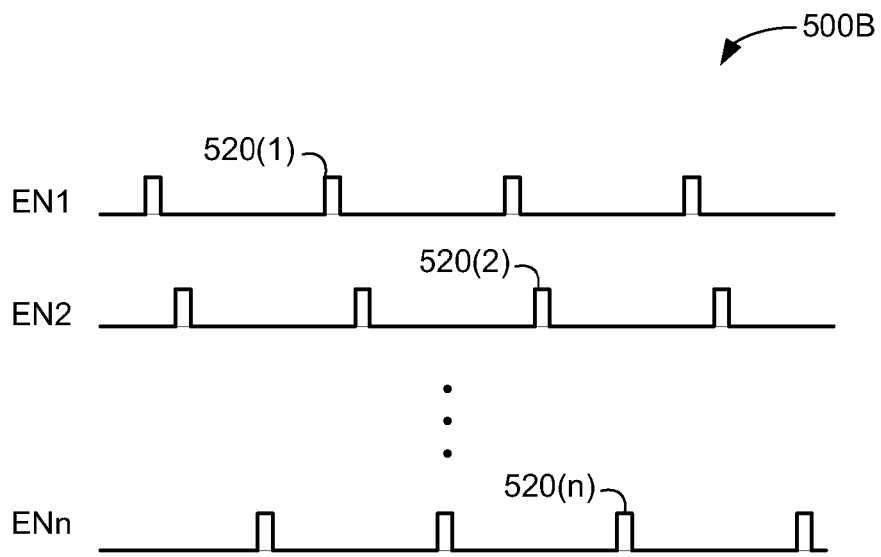
FIG. 5B depicts a timing diagram of another set of enable signal waveforms generated by the state machine of FIG. 4 in accordance with some embodiments.

FIG. 5B depicts a timing diagram 500B illustrating an exemplary set of enable signal waveforms 520(1)-520(n) generated by the state machine 400 of FIG. 4 during the low power mode. As depicted in FIG. 5B, the state machine 400 selectively asserts the enable signals EN1-ENn for brief intervals or pulses, which in turn temporarily enables corresponding gain elements G1-Gn of the dynamically configurable gain circuit of FIG. 3. Thus, during the other time intervals for which the enable signals EN1-ENn are de-asserted (e.g., not pulsed to the asserted state), the corresponding gain elements G1-Gn are disabled, and therefore do not provide gain for the oscillator core 310 and, perhaps more importantly, consume little, if any, power.

As shown in FIG. 5B, the assertion of enable signals EN1-ENn may be sequentially staggered by time delays, for example, as described in more detail below with respect to FIG. 13. The staggered assertion of the enable signals precludes adverse effects on the clocks generated by the oscillator circuit 300 of FIG. 3 resulting from abrupt changes in gain of the gain circuit 320 of the oscillator circuit 300. However, in certain circumstances, operation of the oscillator circuit 300 with zero delay times between enable signals EN1-ENn may be acceptable.

Figure 6:
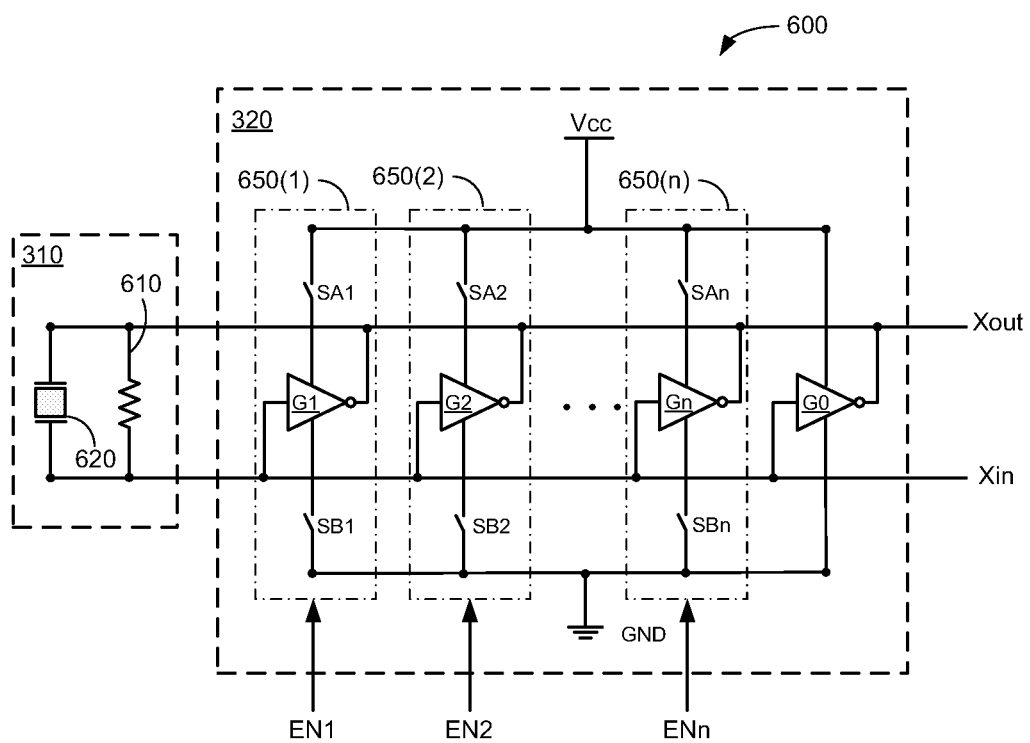
FIG. 6 is a schematic diagram of an exemplary embodiment of the oscillator circuit of FIG. 3.

FIG. 6 is a schematic diagram of an oscillator 600 that is one embodiment of the oscillator circuit 300 of FIG. 3. The oscillator circuit 600 includes the oscillator core 310 connected in parallel with the gain circuit 320. The oscillator core 310 includes a crystal 620 connected in parallel with a resistor 610. The gain circuit 320 includes a number of selectable gain elements 650(1)-650(n), each of which includes a corresponding one of gain elements G1-Gn selectively connected between Vcc and ground potential by a corresponding pair of switches SA and SB, respectively, in response to an associated one of the enable signals EN1-ENn. Thus, each of the gain elements G1-Gn can be selectively enabled and disabled by activating the respective pairs of switches SA1-SAn and SB1-SBn in response to corresponding enable signals EN1-ENn, as depicted in FIG. 6. For example, switches SA2 and SB2 selectively connect gain element G2 between Vcc and ground potential in response to enable signal EN2. For some embodiments, each enable signal EN is formed by a pair of complemented enable signals (e.g., ENA and ENB) that are provided to control terminals of the corresponding pair of switches SA and SB, for example, as described in more detail below with respect to FIG. 7.

For the exemplary embodiment of FIG. 6, gain circuit 320 is shown to include an additional gain element G0 connected directly between Vcc and ground potential without any switches. In this manner, gain element G0 is continuously enabled to provide an uninterrupted gain that sustains oscillations of the oscillator core 310. For other embodiments, any number of gain elements may be connected between Vcc and ground potential without switches. The gain elements G0-Gn and the corresponding switches SA and SB can be implemented in various ways, for example, by using CMOS technology.

Figure 7:
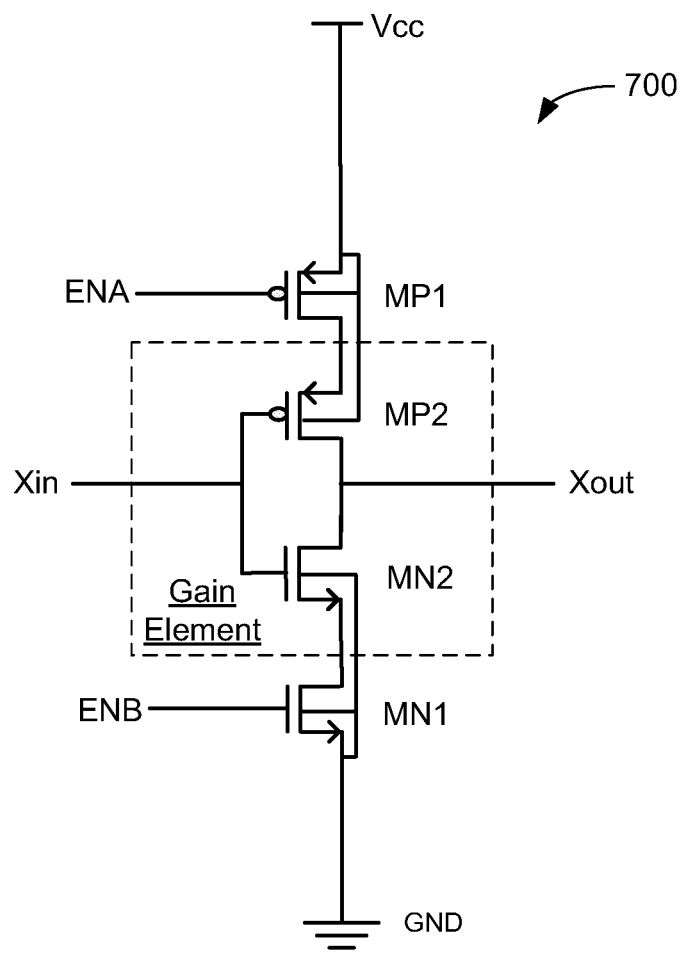
FIG. 7 is a schematic diagram of an exemplary embodiment of a portion of a gain circuit of the oscillator circuit of FIG. 6.

FIG. 7 is a schematic diagram of a selectable gain element 700 that is one embodiment of the selectable gain element 650 of FIG. 6. The selectable gain element 700 includes a first PMOS transistor MP1, a second PMOS transistor MP2, a first NMOS transistor MN1, and a second NMOS transistor MN2. PMOS transistor MP2 and NMOS transistor MN2 form gain element G of FIG. 6. Gate terminals of the PMOS transistor MP2 and the NMOS transistor MN2 are connected together to form an input node (Xin) of the gain element G, and drain terminals of PMOS transistor MP2 and NMOS transistor MN2 are connected together to form an output node (Xout) of the gain element G2. Connections to the power supply Vcc and ground potential for PMOS transistor MP2 and NMOS transistor MN2 are provided by the PMOS transistor MP1 and the NMOS transistor MN1, which operate as switches S2A and S2B of FIG. 6, respectively. A source terminal of the PMOS transistor MP1 is connected to Vcc, while its drain terminal is connected to a source terminal of the PMOS transistor MP2. Bodies of PMOS transistors MP1 and MP2 are jointly connected to the source of PMOS transistor MP1. In a similar fashion, a source terminal of NMOS transistor MN1 is connected to ground potential and its drain terminal is connected to a source terminal of NMOS transistor MN2. Bodies of the NMOS transistors MN1 and MN2 are connected together and to the source of NMOS transistor MN1.

Gate terminals of PMOS transistor MP1 and NMOS transistor MN1 operate as activating terminals of the switches SA and SB, respectively, of FIG. 6. Asserting enable signal ENB to logic high turns on NMOS transistor MN1, and asserting enable signal ENA to logic low turns on PMOS transistor MP1, thereby enabling the gain element by connecting the gain element to power sources Vcc and ground potential. As mentioned earlier, the enable signals are generated by the state machine 400 of FIG. 4, an exemplary embodiment of which is described in more detail below with respect to FIG. 8.

Figure 8:
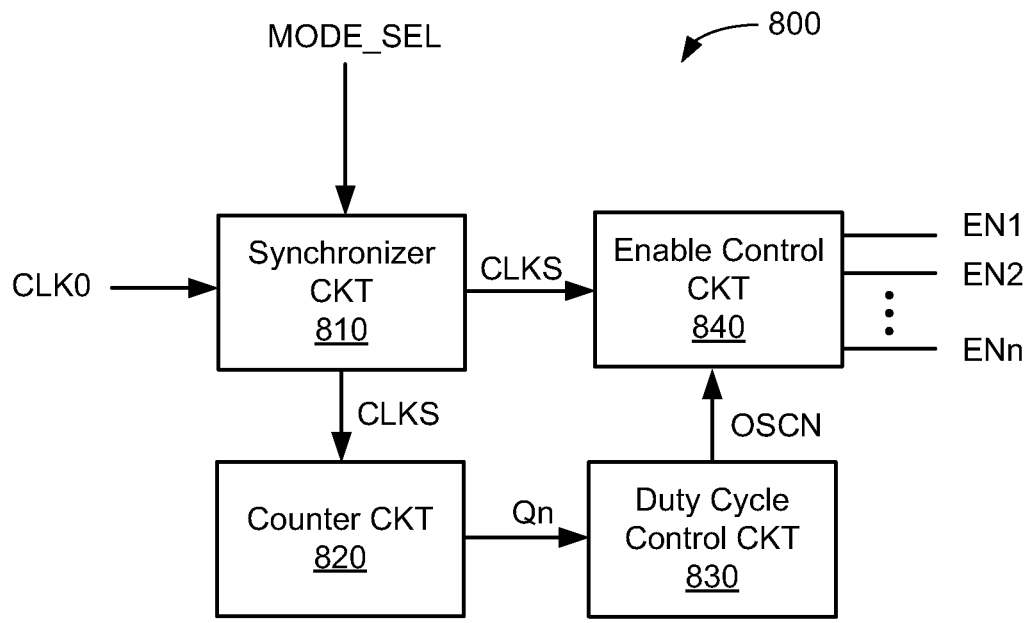
FIG. 8 is a functional block diagram of an exemplary embodiment of the state machine of FIG. 4.

FIG. 8 is a functional block diagram of a state machine 800 that is one embodiment of the state machine 400 of FIG. 4. The state machine 800 includes a synchronizer circuit 810, a counter circuit 820, a duty cycle control circuit 830, and an enable signal control circuit 840. In operation, the state machine 800 receives clock signal CLK0 and mode select signal MODE_SEL, and in response thereto generates the enable signals EN1-ENn. The clock signal CLK0, which is derived from the output Xout of the oscillator circuit 600, is synchronized with mode select signal MODE_SEL by the synchronizer circuit 810 to generate a synchronized clock signal CLKS. The synchronized clock signal CLKS is used by the counter circuit 820 to provide one cycle of an output count signal Qn per each k (e.g., 8) cycles of the synchronized clock signal CLKS. The output count signal Qn is provided to the duty cycle control circuit 830, which in turn modifies the duty cycle of the output count signal Qn to generate an oscillator control signal OSCN. The oscillator control signal OSCN drives the enable signal control circuit 840, which generates the enable signals EN1-ENn for controlling the gain elements G1-Gn of the gain circuit 320 of FIG. 6. Although the state machine 800 is shown in FIG. 8 to include hardware including various circuits, in some embodiments, its functionalities may be performed by software and/or firmware or by a combination of hardware and software and/or firmware.

Figure 9:
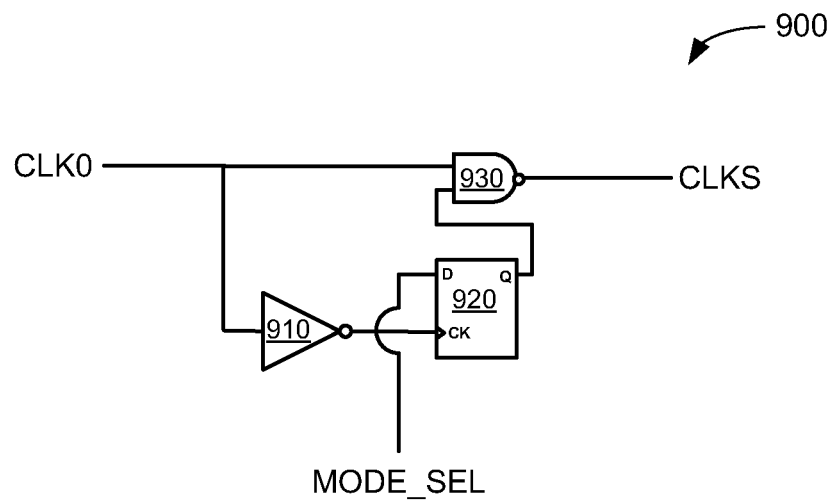
FIG. 9 is a schematic diagram of an exemplary embodiment of the synchronizer circuit of FIG. 8.

FIG. 9 is a schematic diagram of a synchronizer circuit 900 that is one embodiment of the synchronizer circuit 810 of FIG. 8. The synchronizer circuit 900 is shown to include a buffer 910, a flip-flop 920, and a NAND gate 930. For some embodiments, the buffer 910 is a CMOS inverter, as depicted in FIG. 9. The synchronizer circuit 900 receives the clock signal CLK0 derived from the output signal at node Xout of the oscillator circuit 600 of FIG. 6, and synchronizes the clock signal CLK0 with the mode select signal MODE_SEL to generate the synchronized clock signal CLKS. The clock signal CLK0 is fed through the buffer 910 to a clock input of the flip-flop 920, which also receives the mode select signal MODE_SEL as its data (D) input. The Q output of the flip-flop 920 is coupled to a first input of NAND gate 930, which includes a second input to receive CLK0 and includes an output to generate the synchronized clock signal CLKS. In this manner, the NAND gate 930 selectively allows the clock signal CLKS to toggle in response to MODE_SEL.

More specifically, the synchronized clock signal CLKS toggles at the same frequency as the clock signal CLK0. Note that the synchronized clock signal CLKS runs only while MODE_SEL is asserted to a logic high state (e.g., to indicate the normal operational mode). Thus, when MODE_SEL is de-asserted to logic low (e.g., to indicate the low power mode), the synchronized clock signal CKLS no longer toggles. Further, it is noted that the functions performed by synchronizer circuit 900 can be performed by other suitable circuitry.

Figure 10:
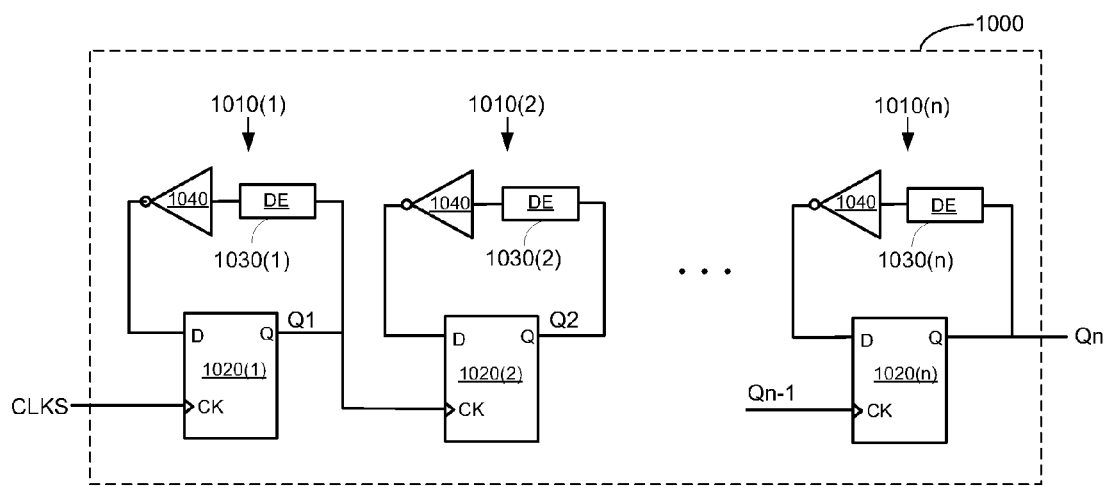
FIG. 10 is a schematic diagram of an exemplary embodiment of the counter circuit of FIG. 8.

FIG. 10 is a schematic diagram of a counter circuit 1000 that is one embodiment of the counter circuit 820 of FIG. 8. The counter circuit 1000, which includes n single-bit counter stages 1010(1)-1010($n$), generates one cycle of the output count signal Qn for each $2^n$ cycles of input synchronized clock signal CLKS. Each counter stage 1010 includes a flip-flop 1020, a delay element 1030, and a buffer 1040. For some embodiments, the buffers 1040 are CMOS inverters, as depicted in FIG. 10.

The Q output of the flip-flop 1020 in each counter stage 1010 is connected to the delay element 1030 in the counter stage 1010 and to a clock input of the flip-flop 1020 in the subsequent counter stage 1010. The output of the delay element 1030 is coupled to the buffer 1040, which in turn is coupled to the D input of the corresponding flip-flop 1020. The first counter stage 1010(1) receives the synchronized clock signal CLKS at its clock input. Each of the counter stages 1010(1)-1010($n$) divides the frequency of the clock signal provided to its clock input by a factor of two. In this manner, the counter circuit 1000 divides the frequency of the synchronized clock signal CLKS by $2^n$. More specifically, the counter circuit 1000 generates one pulse in the output count signal Qn for each $2^n$ cycles of the synchronized clock signal CLKS, as described in more detail below with respect to FIG. 12. Further, it is noted that the functions performed by the counter circuit 1000 can be performed by other suitable circuitry.

Figure 11:
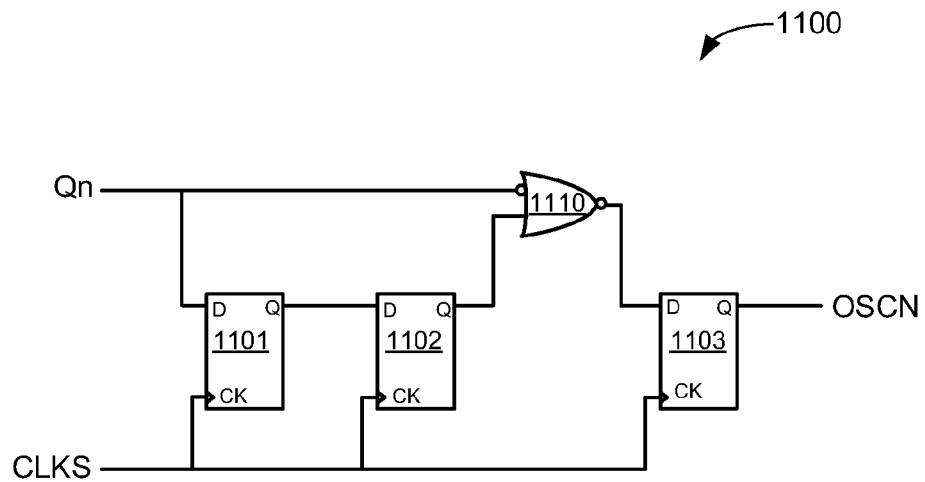
FIG. 11 is a schematic diagram of an exemplary embodiment of the duty cycle control circuit of FIG. 8.

FIG. 11 is a schematic diagram of a duty cycle control circuit 1100 that is one embodiment of the duty cycle control circuit 830 of FIG. 8. The duty cycle control circuit 1100 modifies the duty cycle of the output count signal Qn of the counter circuit 820 to generate the oscillator control signal OSCN. The duty cycle control circuit 1100 includes flip-flops 1101-1103, and also includes a NOR gate 1110. The signal Qn is provided to the D input of flip-flop 1101 and to a negative input of the NOR gate 1110. Clock inputs of the flip-flops 1101-1103 are each coupled to receive the synchronized clock signal CLKS. The Q output of flip-flop 1101 is connected to the D input of flip-flop 1102, and the Q output of flip-flop 1102 is connected to a second input of NOR gate 1110. The output of NOR gate 1110 is connected to the D input of the flip-flop 1103, which includes a Q output to generate the oscillator control signal OSCN.

In operation, the signal Qn is synchronized with the synchronized clock signal CLKS. However, because of delays inherent in flip-flops 1101 and 1102, immediately after signal Qn transitions from logic low to logic high, the signal at the Q output of flip-flop 1102 remains at logic low, which causes the output of NOR gate 1110 to transition to logic high. In response thereto, the Q output of the flip-flop 1103 transitions signal OSCN to logic high. Then, after two cycles of the synchronized clock signal CLKS, the Q output of flip-flop 1102 transitions to logic high, which in turn causes the output of the NOR gate 1110 to transition to logic low, which in turn causes the oscillator control signal OSCN to transition to logic low. Note that the Q output of flip-flop 1102 remains logic low for the rest of the cycle of the signal Qn. Therefore, the next transition in the oscillator control signal OSCN does not occur until the next logic low to logic high transition of the signal Qn. In this manner, the oscillator control signal OSCN has the same period as the signal Qn, and has a duty cycle that is a fraction of the duty cycle of the signal Qn. More specifically, the duty cycle of the oscillator control signal OSCN is $1/k$, where $k=2^n$ and n is the number of counter stages 1010 in the counter circuit 1000 of FIG. 10. The duty cycle of the oscillator control signal OSCN can also be increased by providing additional flip-flops after the flip-flop 1102. For example, if the flip-flops 1101 and 1102 are replaced with m+1 identical flip-flops, then the duty cycle of the oscillator control signal OSCN will change to m/k. Further, it is noted that the functions performed by the duty cycle control circuit 1100 can be performed by other suitable circuitry.

Figure 12:
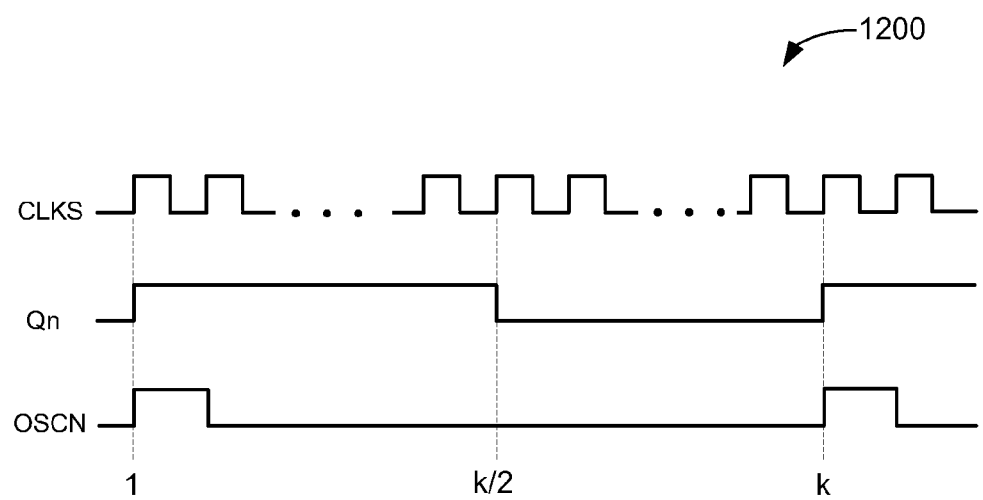
FIG. 12 is a timing diagram of signals generated by the circuits of FIGS. 10 and 11.

FIG. 12 is a timing diagram 1200 illustrating signals generated by the circuits of FIGS. 10 and 11. The timing diagram 1200 depicts an exemplary relationship between signals CLKS, Qn, and OSCN. The signal Qn oscillates with a period $k=2^n$ times longer than the period of the synchronized clock signal CLKS. As mentioned above, the oscillator control signal OSCN has the same period as the signal Qn, and has a duty cycle equal $1/k$, where $k=2^n$ and n is the number of counter stages 1010 in the counter circuit 1000 of FIG. 10.

Figure 13:
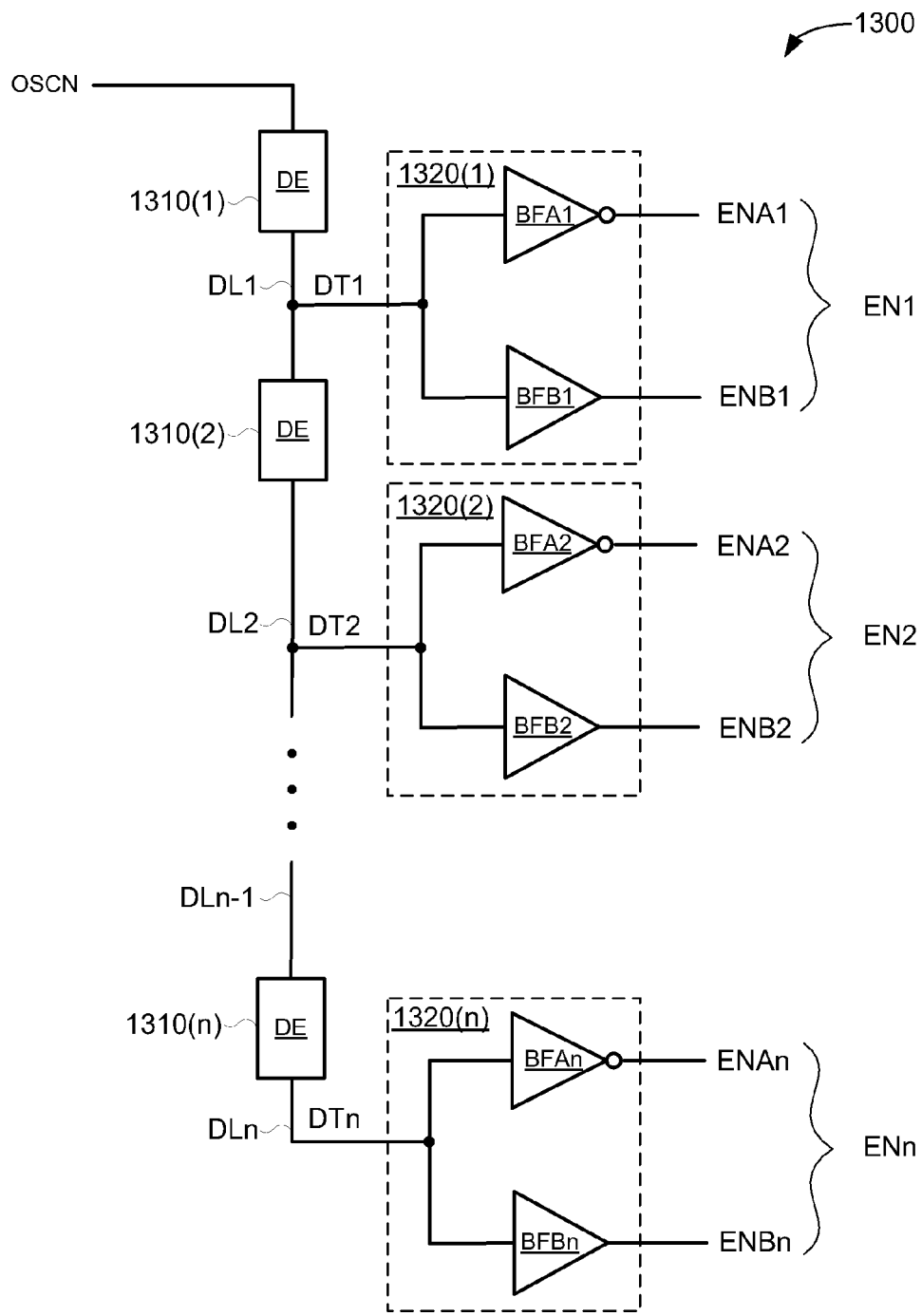
FIG. 13 is a schematic diagram of exemplary embodiment of the enable signal control circuit of FIG. 8.

FIG. 13 is a schematic diagram of an enable signal control circuit 1300 that is one embodiment of the enable signal control circuit 840 of FIG. 8. The enable signal control circuit 1300 includes a number n of delay elements 1310(1)-1310($n$) and a number n of corresponding buffer circuits 1320(1)-1320($n$). During the low power mode, the signal OSCN is active (e.g., oscillating), and the delay elements 1310(1)-1310($n$) provide sequentially staggered time-delayed signals DT1-DTn to corresponding buffer circuits 1320(1)-1320($n$) via associated delay lines DL1-DLn. In response thereto, the buffer circuits 1320(1)-1320($n$) sequentially assert the enable signals EN1-ENn to selectively enable and disable the respective gain elements G1-Gn of FIG. 3 in a staggered manner.

More specifically, each buffer circuit 1320 includes an inverting buffer BFA and a non-inverting buffer BFB. The inputs of each pair of buffers BFA and BFB are coupled to the associated delay line DL, and the outputs of the pair of buffers BFA and BFB generate respective enable signals ENA and ENB that together form the enable signal EN provided to a corresponding one of the gain elements G1-Gn of FIG. 3. For embodiments described herein, signal ENA is the logical complement of signal ENB. Referring also to FIG. 7, the pair of complemented enable signals ENA and ENB are provided to the gates of respective transistors MP1 and MN1 of the selectable gain element 700.

The first delay element 1310(1) has an input to receive the signal OSCN and has an output to provide DT1 to the input of the first buffer circuit 1320(1) and to the input of the second delay element 1310(2) via the first delay line DL1. The outputs of the first buffer circuit 1320(1) generate the enable signals ENA1 and ENB1 that together form the enable signal EN1 that controls the first gain element G1 of FIG. 3. The output of the second delay element 1310(2) provides DT2 to the input of the second buffer circuit 1320(2) and to the input of the next delay element 1310(3) via the second delay line DL2. The outputs of the second buffer circuit 1320(2) generate the enable signals ENA2 and ENB2 that together form the enable signal EN2 that controls the second gain element G2 of FIG. 3. The input of the last delay element 1310($n$) has an output to provide DTn to the input of the last buffer circuit 1320(*n*) via the last delay line DLn. The outputs of the last buffer circuit 1320(*n*) generate the enable signals ENAn and ENBn that together form the enable signal ENn that controls the last gain element Gn of FIG. 3. In some embodiments, the delay line can be implemented as a series of combinational gate delays, and in other embodiments the delay line can be implemented with synchronous flip flops.

Figure 14:
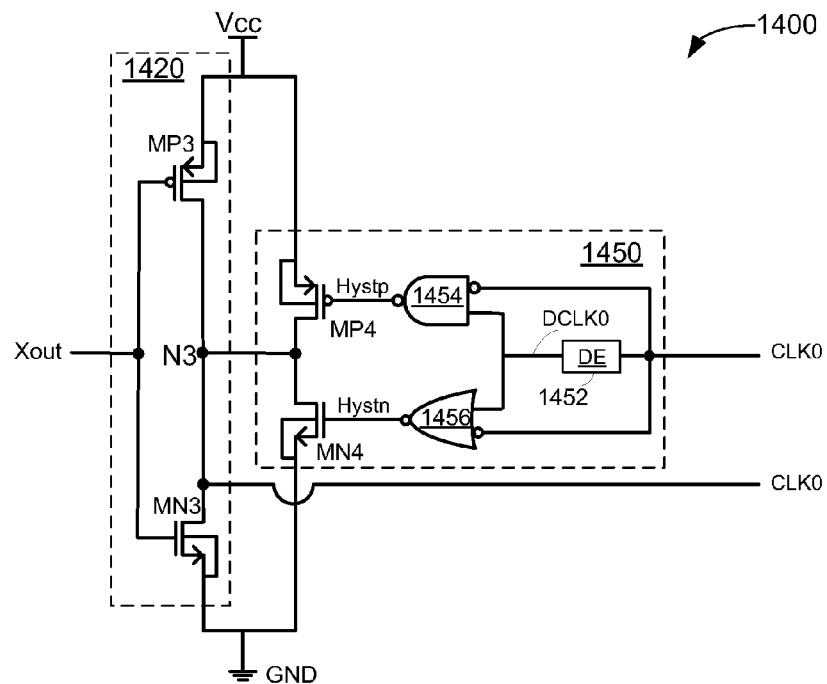
FIG. 14 is a schematic diagram of a glitch reduction circuit for the oscillator circuit of FIG. 6 in accordance with some embodiments.

FIG. 14 is a schematic diagram of a glitch reduction circuit 1400 that can be used in conjunction with the oscillator circuit 600 of FIG. 6 in accordance with some embodiments. The glitch reduction circuit 1400 reduces added glitches at the output signal Xout of the oscillator circuit 600, and also provides a clean clock signal CLK0. In some embodiments, the oscillator input signal Xin can be used instead of the oscillator output signal Xout. The glitch reduction circuit 1400 is shown to include a buffer circuit 1420 and a hysteresis circuit 1450. The buffer circuit 1420, which may provide a power gain for the output signal Xout, includes a PMOS transistor MP3 and an NMOS transistor MN3 connected in series between Vcc and ground potential. The gates of transistors MP3 and MN3 are connected together and receive the signal Xout. The commonly-coupled drain terminals of transistors MP3 and MN3 provide clock signal CLK0 at an output node N3.

The hysteresis circuit 1450 includes a delay element 1452, a NAND gate 1454, a NOR gate 1456, a PMOS transistor MP4, and an NMOS transistor MN4. The delay element 1452 delays CLK0 by a delay time DT to generate a delayed clock signal DCLK0. The delayed clock signal DCLK0 is also provided to negative (e.g., complemented) inputs of NAND gate 1454 and NOR gate 1456, and clock signal CLK0 is provided to the other inputs of NAND gate 1454 and NOR gate 1456. The output of the NAND gate 1454 generates a first hysteresis signal Hystp, and the output of the NOR gate 1456 generates a second hysteresis signal Hystn. The Hystn signal is briefly asserted immediately after the falling edge of CLK0, which causes NMOS transistor MN4 to briefly turn on and provide an additional path from output node N3 to ground potential for a possible glitch current of the conducting PMOS transistor MP3. Similarly, the Hystp signal is asserted immediately after the falling edge of CLK0, which causes PMOS transistor MP4 to turn on and provide an additional path to Vcc for a possible glitch current of the conducting NMOS transistor MN3. It is to be noted that the function performed by circuit 1400 can be performed by other suitable circuitry.

Figure 15:
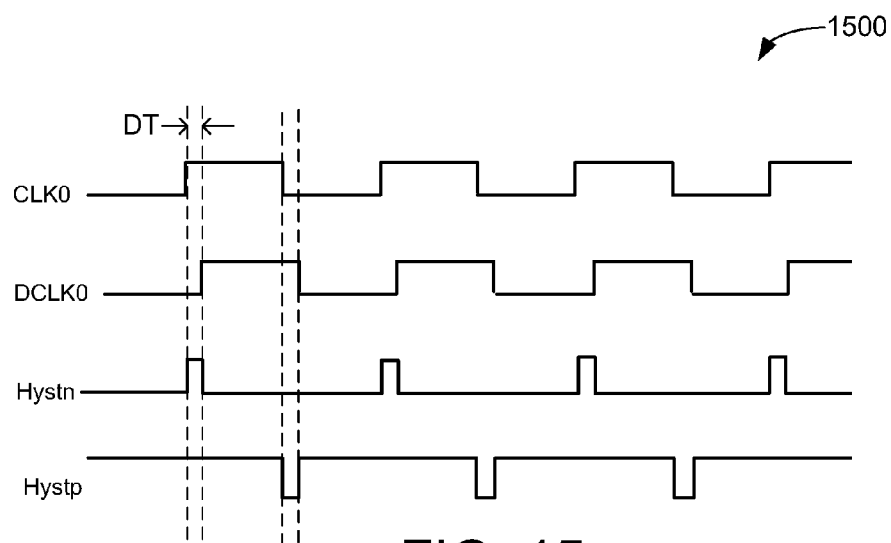
FIG. 15 is a timing diagram of exemplary signals generated by the circuit of FIG. 14.

FIG. 15 is a timing diagram 1500 illustrating signals associated with the circuit of FIG. 14. The signals shown in the timing diagram 1500 include CLK0, the delayed clock signal DCLK0, and the signals Hystn and Hystp signals. The delayed clock signal DCLKS has a delay (equal to delay time DT of the delay element 1452) with respect to CLK0. The Hystn signal first transitions to logic high immediately after the rising edge of the synchronized clock signal CLK0, and then transitions back to logic low immediately after the rising edge of the delayed signal DCLK0. The Hystp signal first transitions to logic low immediately after the falling edge of CLK0, and then transitions back to logic high immediately after the falling edge of the delayed clock signal DCLK0. The Hystn and Hystp signals provide paths to ground potential for possible glitches in the current signals of the buffer circuit 1420 of FIG. 14.

Figure 16:
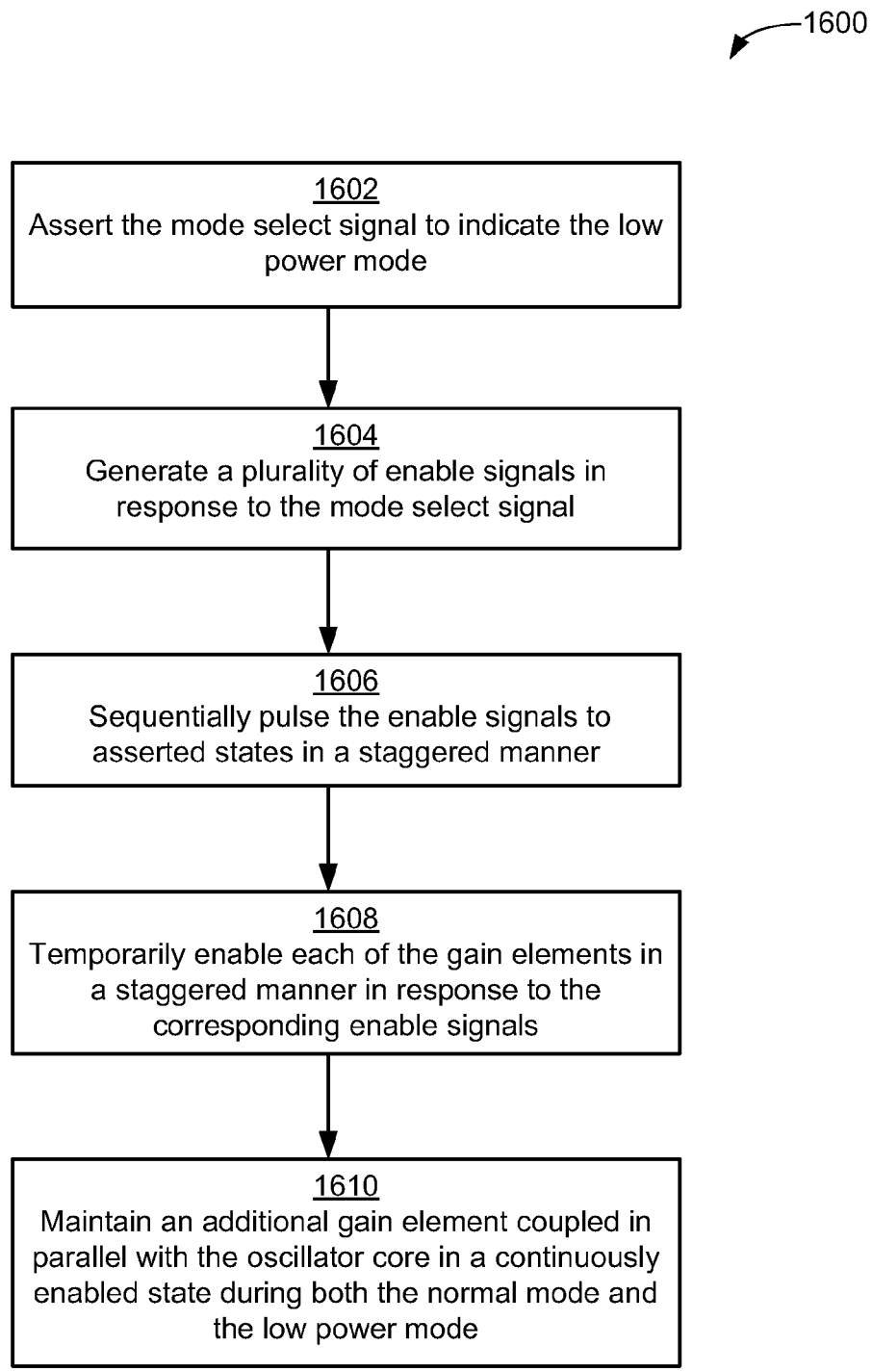
FIG. 16 is a flow chart illustrating a method for reducing the operational power level in oscillator circuits in accordance with some embodiments.

FIG. 16 is a flow chart illustrating a method 1600 for reducing the operational power level in the oscillator circuit 300 of FIG. 3 during the low power mode. First, the mode select signal is asserted to indicate the low power mode (1602). Then, the plurality of enable signals are generated in response to the mode select signal (1604). Next, the enable signals are sequentially pulsed to asserted states in a staggered manner (1606), and each of the gain elements is temporarily enabled in a staggered manner in response to the corresponding enable signals (1608). For some embodiments, an additional gain element coupled in parallel with the oscillator core is maintained in a continuously enabled state during both the normal mode and the low power mode (1610).

In the foregoing specification, the present embodiments have been described with reference to specific exemplary embodiments thereof. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense.

What is claimed is:

1. An oscillator circuit configured to selectively switch between a low power mode and a normal mode of operation, the oscillator circuit comprising:
    an oscillator core configured to generate a clock signal; and
    a dynamically configurable gain circuit including a plurality of first gain elements, each selectively connected in parallel with the oscillator core in response to a corresponding one of a plurality of enable signals, wherein during the low power mode, the enable signals are sequentially pulsed to an asserted state to temporarily enable the corresponding first gain circuits during staggered time intervals with respect to the clock signal.

2. The oscillator circuit of claim 1, wherein during the normal mode, all of the enable signals are continuously asserted to maintain all of the first gain elements in an enabled state, and during the low power mode, the enable signals are to enable the first gain elements only during selected time intervals.

3. The oscillator circuit of claim 1, wherein the enable signals are selectively pulsed in a staggered manner such that only a fraction of the plurality of first gain circuits are enabled at the same time.

4. The oscillator circuit of claim 1, further comprising a second gain element connected in parallel with the oscillator core and maintained in a continuously enabled state, and wherein only one of the first gain circuits is enabled at the same time during the low power mode.

5. The oscillator circuit of claim 1, wherein each of the first gain elements comprises:
    a first switch connected between a supply voltage and a first node, and having a control terminal to receive a corresponding enable signal;
    a first PMOS transistor and a first NMOS transistor connected in series between the first node and a second node, wherein gates of the first PMOS and first NMOS transistors are coupled to a first terminal of the oscillator core, and wherein sources of the first PMOS and first NMOS transistors are coupled to a second terminal of the oscillator core; and
    a second switch connected between ground potential and the second node, and having a control terminal to receive a logical complement of the corresponding enable signal.

6. The oscillator circuit of claim 1, further comprising a state machine to generate the enable signals in response to a mode select signal indicating whether the oscillator circuit is operating in the normal mode or in the low power mode.

7. The oscillator circuit of claim 6, wherein the state machine comprises:

a synchronizer circuit configured to synchronize the clock signal with the mode select signal to generate a synchronized clock signal;

a counter circuit configured to pulse an output count signal to an asserted state for every k cycles of the synchronized clock signal, wherein k is an integer greater than 1;

a duty cycle control circuit configured to generate an oscillator control signal in response to the output count signal; and an enable signal control circuit configured generate the enable signals in response to the oscillator control signal and the synchronized clock signal.

8. The oscillator circuit of claim 7, wherein during the low power mode, the enable signals are sequentially pulsed to asserted states in a staggered manner such that only one of the enable signals is asserted at the same time.

9. The oscillator circuit of claim 7, wherein during the normal mode, the enable signals are continuously asserted.

10. An integrated circuit including an oscillator circuit configured to selectively switch between a low power mode and a normal mode of operation in response to a mode select signal, the oscillator circuit comprising:

an oscillator core for generating a clock signal;

a plurality of first gain elements coupled in parallel with the oscillator core, wherein each of the first gain elements is selectively disabled in response to a corresponding one of a plurality of enable signals; and a state machine configured to sequentially pulse the enable signals to an asserted state in response to the mode select signal indicating the low power mode, wherein the sequentially pulsed enable signals temporarily enable the first gain elements in staggered time intervals with respect to the clock signal.

11. The integrated circuit of claim 10, wherein during the low power mode, only one of the first gain elements is enabled at the same time.

12. The integrated circuit of claim 11, wherein during the normal mode, all of the enable signals are continuously asserted to maintain all of the first gain elements in the enabled state.

13. The integrated circuit of claim 10, further comprising a second gain element connected in parallel with the oscillator core and maintained in a continuously enabled state during both the normal mode and the low power mode.

14. The oscillator circuit of claim 10, wherein the state machine comprises:

a synchronizer circuit configured to synchronize the clock signal with the mode select signal to generate a synchronized clock signal;

a counter circuit configured to pulse an output count signal to an asserted state for every k cycles of the clock signal, wherein k is an integer greater than 1;

a duty cycle control circuit configured to generate an oscillator control signal in response to the output count signal; and an enable signal control circuit configured generate the enable signals in response to the oscillator control signal and the synchronized clock signal.

15. The oscillator circuit of claim 10, wherein each of the first gain elements comprises:

a first switch connected between a supply voltage and a first node, and having a control terminal to receive a corresponding enable signal;

a first PMOS transistor and a first NMOS transistor connected in series between the first node and a second node, wherein gates of the first PMOS and first NMOS transistors are coupled to a first terminal of the oscillator core, and wherein sources of the first PMOS and first NMOS transistors are coupled to a second terminal of the oscillator core; and a second switch connected between ground potential and the second node, and having a control terminal to receive a logical complement of the corresponding enable signal.

16. A method of operating an oscillator circuit having a plurality of gain elements coupled in parallel with an oscillator core and configured to operate in either a normal mode or in a low power mode, the method comprising:

asserting the mode select signal to indicate the low power mode;

generating a plurality of enable signals in response to the mode select signal;

sequentially pulsing the enable signals to asserted states in a staggered manner; and temporarily enabling each of the gain elements in a staggered manner in response to the corresponding enable signals.

17. The method of claim 16, wherein during the low power mode, only one of the gain elements is enabled at the same time.

18. The method of claim 17, wherein during the normal mode, all the enable signals are continuously asserted.

19. The method of claim 16, further comprising:

maintaining an additional gain element coupled in parallel with the oscillator core in a continuously enabled state during both the normal mode and the low power mode.

* * * * *